United States Patent [19]

Gates et al.

[11] 4,117,039

[45] Sep. 26, 1978

[54] LIGHT SENSITIVE MATERIALS

[75] Inventors: Allen Peter Gates, Knaresborough; Allan Saunderson, Bradford, both of England

[73] Assignee: Vickers Limited, London, England

[21] Appl. No.: 636,363

[22] Filed: Dec. 1, 1975

Related U.S. Application Data

[63] Continuation-in-part of Ser. No. 463,428, Apr. 23, 1974, abandoned.

[30] Foreign Application Priority Data

Apr. 26, 1973 [GB] United Kingdom ............... 19994/73

[51] Int. Cl.$^2$ .............................................. C08F 8/34
[52] U.S. Cl. .................... 260/875; 260/17 A; 260/17.4 CL; 260/885; 526/15; 526/23; 526/40; 526/49; 526/9; 96/115 R; 528/133; 528/109; 528/87; 528/38; 528/424
[58] Field of Search ............... 260/49, 79.3 M, 2 EN, 260/17.4 CL, 17 A, 836, 844, 875, 72.5, 59 R, 885; 526/15, 23, 30, 49

[56] References Cited

U.S. PATENT DOCUMENTS

| | | | |
|---|---|---|---|
| 3,053,806 | 9/1962 | La Combe et al. | 260/49 |
| 3,821,167 | 6/1974 | Asano | 260/49 |
| 3,843,603 | 10/1974 | Gates | 260/47 EP |

Primary Examiner—Lester L. Lee

[57] ABSTRACT

A light sensitive material suitable for coating onto a support to produce a light sensitive plate for use in, for example, the manufacture of a printing plate comprises groups of the formula:

$$-Z-SO_2-R-(CR_1=CR_2)_a-CR_3=C\begin{matrix}COOH\\ \\R_4\end{matrix}$$

-continued
or $$\begin{matrix}HOOC\\ \\-Z-SO_2-Ph\end{matrix}C=CR_3-(CR_2=CR_1)_a-R-X$$

attached to carbon atoms of a polymer, wherein —Z— is —O— or $$-\underset{|}{N}-$$

or $$-\underset{R_5}{\overset{|}{N}}-$$

wherein $R_5$ represents a hydrogen atom or an alkyl group; R is an aromatic radical; $a$ is zero or unity; $R_1$, $R_2$ and $R_3$ are hydrogen atoms, halogen atoms, cyano groups, or specified aliphatic or aromatic groups; X is a deactivating group; $R_4$ is a hydrogen atom, a carboxyl group, a cyano group or a specified aliphatic or aromatic group; and Ph is a phenyl group. The material may be produced by reacting a polymer containing epoxide groups, hydroxyl groups, or primary and/or secondary amino groups with the halosulphonyl group of a compound having the formula:

$$X-R-(CR_1=CR_2)_a-CR_3=C\begin{matrix}COOH\\ \\R_4\end{matrix}$$

wherein R, $R_1$, $R_2$ $R_3$, and $a$ having the above meanings, wherein X has the above meaning or is a halosulphonyl group and $R_4$ has the above meaning or, in the case where X is a deactivating group, is a halosulphonyl substituted group.

8 Claims, No Drawings

LIGHT SENSITIVE MATERIALS

This is a continuation in-part application of our application Ser. No. 463,428 filed on the Apr. 23, 1974 and now abandoned.

This invention relates to light sensitive material and more particularly is concerned with light sensitive material which is suitable for the production of printing plates.

According to the present invention there is provided a light sensitive material comprising groups of the formula

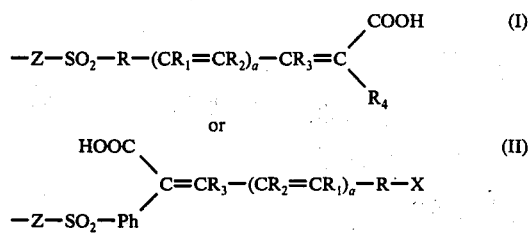

attached to carbon atoms of a polymer, wherein R represents an aromatic radical; $a$ is zero or unity; $R_1$, $R_2$ and $R_3$, which may be the same or different each represents a hydrogen atom, a halogen atom, a cyano group, an alkyl group, an aryl group, an alkoxy group, an aryloxy group, an aralkyl group or an aralkoxy group; —Z— represents —O— or

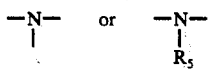

wherein $R_5$ represents a hydrogen atoms or an alkyl group; $R_4$ is an alkyl group, an alkoxy carbonyl group, a carboxyl group, a cyano group, a phenyl group substituted with a deactivating group, or a hydrogen atom; Ph is a phenyl group; and X is a deactivating group.

The light sensitive material of the present invention is alkali-soluble and comprises a polymer backbone to which light sensitive side chains having terminal carboxylic acid groups are attached through sulphonyloxy groups or sulphonamido groups. In the case where the light sensitive chains are attached through sulphonamido groups, the nitrogen atom of the sulphonamido group may form part of the polymer backbone or may be part of a side chain attached to the backbone.

The deactivating group may be any group which renders the aromatic nucleus to which it is attached less reactive to further substitution by an electrophilic reagent. Groups which have this effect are well known and are described in, for example, pages 799 to 809 (Section 22-5) of the textbook entitled "Basic Principles of Organic Chemistry" by Roberts & Caserio, 1964.

The light sensitive material of the present invention can be obtained by reacting a polymer containing a plurality of epoxide groups, hydroxyl groups or primary and/or secondary amino groups with the halo-sulphonyl group of at least one compound having the general formula

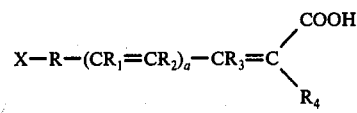

wherein R represents an aromatic radical optionally substituted with one or more groups additional to the X group; $a$ is either 0 or 1; $R_1$, $R_2$ and $R_3$, which may be the same or different, each represents a hydrogen atom, a halogen atom, a cyano group, an alkyl group, an aryl group, an alkoxy group, an aryloxy group, an aralkyl group or an aralkoxy group; $R_4$ represents a hydrogen atom when $a$ is 1 or when $a$ is 0 or 1, an alkyl or alkoxy carbonyl group or, more preferably, a group selected from carboxyl, cyano, deactivated phenyl and halosulphonyl phenyl groups; and X represents a halosulphonyl group, or in the case where $R_4$ represents a halosulphonyl phenyl group and only then, a deactivating group. When $R_4$ is a halosulphonyl phenyl group, it is necessary that a deactivating group such as a halogen substituent is present on the aromatic radical R to prevent introduction of a halosulphonyl group into R which would lead to cross linking between R and $R_4$. Similarly, when X is a halosulphonyl group and $R_4$ is a phenyl group, $R_4'$ must carry a deactivating group. It is particularly preferred for $R_4$ in the formula to comprise a carboxyl group since this enhances the alkali solubility of the light sensitive material. It is also particularly preferred for $a$ in the formula to have a value of unity rather than zero since the resultant increase in unsaturation enhances the light-sensitivity of the material.

In the case where the light-sensitive material is produced by reacting the halosulphonyl group-containing compound with a polymer which contains a plurality of hydroxyl groups, the polymer may be, for example an epoxy or phenoxy resin (derived from a bisphenol and epichlorhydrin); poly(vinyl alcohol); a partially hydrolysed poly(vinyl ester) such as poly(vinyl alcohol acetate); a naturally occurring material such as cellulose or starch and derivatives thereof formed by partial esterification or etherification e.g. hydroxypropyl cellulose; poly(hydroxy-ethylacrylate) or poly(hydroxy ethyl methacrylate); partially hydrolysed acetals such as partially hydrolysed poly(vinyl butyral), partially hydrolysed poly(vinyl cinnamal) and mixtures thereof; a condensation product of phenol or a substituted phenol with an aldehyde e.g. phenol formaldehyde resin, resorcinol-formaldehyde resin and 2,4-dihydroxy-benzoic acid-formaldehyde resin; or a condensation product of a substituted or non-substituted phenoxy alkanol with an aldehyde e.g. the resin formed by condensing 2-phenoxyethanol with formaldehyde. The condensation products of phenols and phenoxyalkanols with aldehydes are characterised by the following molecular structure

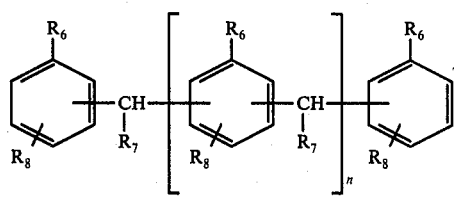

wherein $n$ is at least 2; $R_6$ represents a hydroxy or hydroxyalkoxy group; $R_7$ represents hydrogen or a lower alkyl, aryl or aralkyl group, and $R_8$ represents from 0 to 3 substituents selected from alkyl, halogen, alkoxy, hydroxy, aryl, and aralkyl groups.

In the case where the light sensitive material is produced by reacting the halosulphonyl group-containing compound with a polymer which contains a plurality of primary and/or secondary amino groups, the polymer may be, for example, poly(ethylene imine); poly(vinyl amine); an aniline-formaldehyde resin; the product obtained by condensing a styrene maleic anhydride copolymer or an alkylvinylether maleic anhydride copolymer with excess of an aliphatic or aromatic diamine, the product being characterised by the repeating unit

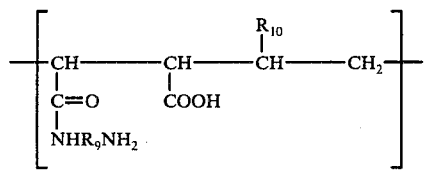

wherein $R_9$ represents, an aliphatic or aromatic group and $R_{10}$ is an alkoxy, phenyl or phenoxy group; poly (amino styrene); poly(vinyl anthranilates); an aminobenzaldehyde acetal of poly(vinyl alcohol); a polyamino alkyl acrylamide; an amide containing heterocyclic polymer e.g. poly(amino triazole); or a naturally occurring polymer such as gelatin or casein. If the polymer is of the type where the amino groups are present in side chains attached to a polymer backbone consisting entirely of carbon atoms, the groups Z of the resultant light sensitive material have the formula

wherein $R_5$ represents a hydrogen atom or an alkyl group and one of the other nitrogen atom bonds is connected to a carbon atom of the polymer backbone. If, on the other hand, the polymer is of the type where the amino groups are present in the polymer backbone itself, e.g. as in the case where the polymer is poly (ethylene imine), the groups Z of the resultant light sensitive material have the formula

wherein two of the nitrogen atom bonds are connected to carbon atoms of the backbone.

In the case where the light sensitive material is produced by reacting the halosulphonyl group-containing compound with a polymer which contains epoxide groups, the polymer may be an epoxy resin produced by condensing epichlorhydrin and, for example, bisphenol A or a novolakepoxy resin produced by condensing a phenol-(or cresol-) formaldehyde novolak resin and epichlorhydrin.

Suitable compounds containing a halosulphonyl group and which may be reacted with the aforementioned polymers to produce the light sensitive material are:-

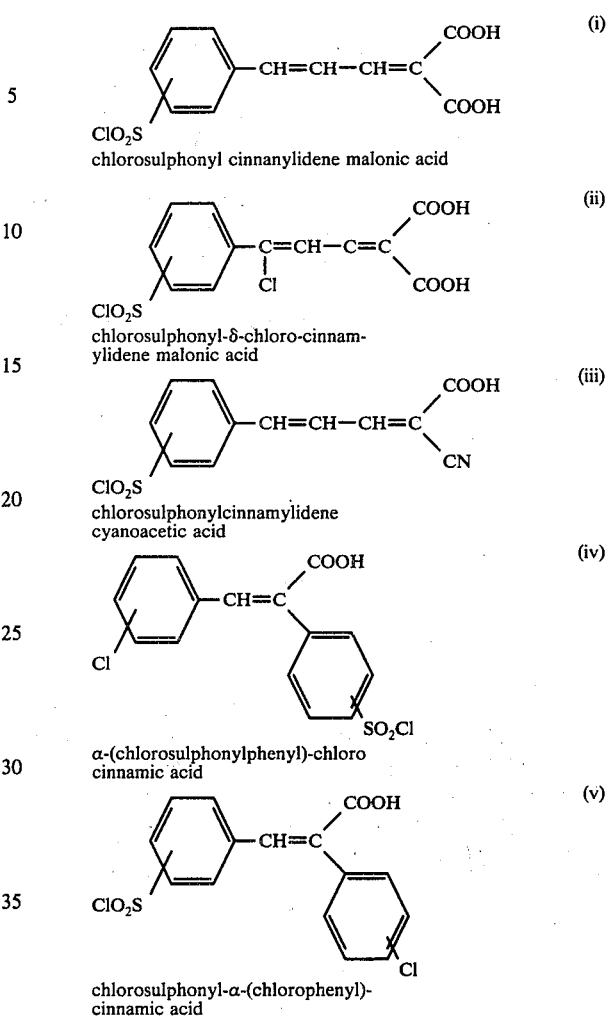

Such compounds may be used singly, in combination with one another, or in combination with one or more halides of other aromatic sulphonic acids and of aliphatic and aromatic carboxylic acids, which halides do not contain free carboxylic acid groups. In the latter case the light sensitive material of the invention additionally includes groups of the formula $-Y-SO_2-R_{11}$ or $-Y-CO-R_{12}$ attached to carbon atoms of the polymer wherein $-Y-$ represents $-O-$ or

$R_{11}$ is an aromatic radical containing no free carboxylic acid groups and $R_{12}$ is an aliphatic radical containing no free carboxylic acid groups or an aromatic radical containing no free carboxylic acid groups. Thus for example, the specified halosulphonyl group-containing compound(s) may be used in combination with the halides e.g. chlorides of p-toluene sulphonic acid, acetic acid, propionic acid, benzoic acid, p-azidobenzoic acid or cinnamic acid. The reaction of such non-free carboxylic acid group-containing acid halides with the polymer may take place not only simultaneously with the reaction of the specified halosulphonyl group-containing compound of the above general formula but also previously or subsequently.

In the case where the light sensitive material is formed by the reaction of a polymer containing a plurality of hydroxyl groups with a halosulphonyl group-containing compound of the formula specified above wherein X is a halosulphonyl group, the material comprises groups of the formula:

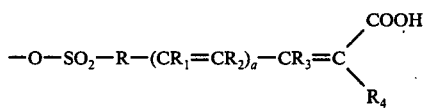

attached to carbon atoms of the polymer, wherein R, $R_1$, $R_2$, $R_3$, and $a$ have the meanings specified above and $R_4$ is an alkyl group, an alkoxy carbonyl group, a carboxyl group, a cyano group, a phenyl group substituted with a deactivating group or a hydrogen atom.

If the polymer used contains a plurality of primary and/or secondary amino groups, the light sensitive material obtained by reacting the polymer with a halosulphonyl group-containing compound of the formula specified wherein X is a halosulphonyl group comprises groups of the formula:

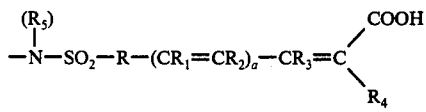

attached to carbon atoms of the polymer, wherein R, $R_1$, $R_2$ $R_3$, $R_5$, and $a$ have the meanings specified above and $R_4$ is an alkyl group, an alkoxy carbonyl group, a carboxyl group a cyano group, a phenyl group substituted with a deactivating group, or a hydrogen atom.

In the case where the light sensitive material is produced by reacting a polymer containing a plurality of hydroxyl groups with a halosulphonyl group-containing compound of the formula specified wherein $R_4$ is a halosulphonyl substituted phenyl group and X is a deactivating group, it comprises groups of the formula:

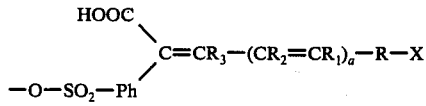

attached to carbon atoms of the polymer, wherein R, $R_1$, $R_2$, $R_3$, Ph, and $a$ have the meanings specified above, and X is the deactivating group.

In the case where the light sensitive material is produced by reacting a polymer containing a plurality of primary and/or secondary amino groups with a halosulphonyl group-containing compound of the formula specified wherein $R_4$ is a halosulphonyl phenyl group and X is a deactivating group, it comprises groups of the formula:

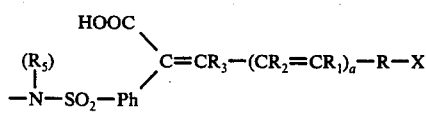

attached to carbon atoms of the polymer, wherein R, $R_1$, $R_2$, $R_3$, $R_5$, Ph, and $a$ have the meanings specified above and wherein X is the deactivating group.

Although the light sensitive material of the present invention is generally prepared by reaction of the halosulphonyl compound with epoxide, hydroxy or amine groups of a polymer, the material can be prepared by other methods as is illustrated in Example 9.

The light sensitive materials of the present invention are of particular value in the production of photographically produced printing plates and the like. The present invention therefore further includes a light sensitive plate comprising a support of a material to which a film of the light sensitive material will adhere, such as glass, paper, resin impregnated paper, synthetic resin foil, or metal such as aluminum, zinc, magnesium or chopper, which support carries a layer of the light sensitive material.

In order to apply the light sensitive layer to the support the light sensitive material is dissolved in a suitable solvent or mixture of solvents, such as dimethyl formamide, dioxane, 2-ethoxyethanol, 2-ethoxyethyl acetate or ethyl methyl ketone, and the resultant solution is applied to the support in conventional manner, such as by dipping, spraying or whirler coating. Thereafter, the solvent is evaporated either by air drying or heating to leave a layer of the light sensitive material on the support. The coating weight per square meter is generaly between 0.2 and 2.0 gm.

For coating purposes in industry it may be desirable to add, to the light sensitive material of the present invention, dyestuffs, pigments, plasticisers, wetting agents, sensitisers, stabilizers, non-reactive polymers and the like.

In case, the light sensitive plate is image-wise exposed for a time depending on the composition of the layer, the layer thickness, the support, the intensity of the light source, and the intended product. The non-light struck areas remain soluble in alkali whereas the light-struck areas become insolubilised. Thus, the image on the exposed plate is alkali developable.

The alkaline aqueous solution used for developing the exposed plate should have a good solvent action on the non-light struck areas, yet have little action on the light hardened image. An alkaline developer which may conveniently be used is an aqueous solution of a phosphate or a metasilicate of an alkali metal. To this solution may be added from 5 to 30% of a water miscible organic solvent e.g. an alcohol, to facilitate complete removal of all unexposed material.

Preferred fields of application for the light sensitive material of the invention are the manufacture of lithographic printing plates, the manufacture of etch resists, the preparation of printed circuits and the like, chemical milling, and the production of ornamental effects.

The following Examples illustrate the invention

EXAMPLE 1

(a) Preparation of chlorosulphonylcinnamylidene malonic acid (formula i)

Cinnamaldehyde and melonic acid were condensed together in glacial acetic acid at 100° C. The condensate was recrystallised from ethanol and was found to have a melting point of 206° C. The condensate was reacted with chlorosulphonic acid at 60° C. and the resultant chlorosulphonylcinnamylidene malonic acid was isolated by slowly pouring the reaction mixture into stirred ice water.

(b) Preparation of resorcinol/formaldehyde resin

Resorcinol, excess formaldehyde, and sodium sulphate were dissolved in water and heated with stirring on a water bath. As soon as the solution became cloudy, the reaction was terminated by the addition of a large volume of cold water. The precipitate was filtered off, washed with water, and dried at room temperature.

(c) Preparation of the light-sensitive material

Equivalent weights of chlorosulphonylcinnamylidene malonic acid and resorcinol-formaldehyde resin prepared as above were dissolved in acetone and sodium carbonate solution was added. The mixture was stirred at 20° C. for 1 hour. The resultant light sensitive ester was filtered off, redissolved in water and then precipitated by the addition of hydrochloric acid.

(d) Preparation of a printing plate

A 3% solution of the above light sensitive material in a mixture of dimethyl formamide and 2-ethoxyethanol was applied by means of a whirler to the surface of a sheet of electrograined and anodised aluminum so as to give a coating weight of about 0.5 g/sq. meter. After drying the resultant light sensitive plate was exposed for 2 minutes in contact with a negative to a 4000 watt pulsed zenon lamp at a distance of 0.65 meters. The exposed plate was developed with a 2.5% solution of trisodium phosphate to remove those areas of the light sensitive coating which had not been struck by light during the exposure. The plate was then washed with water and 2% sulphuric acid and inked with greasy ink.

EXAMPLE 2

(a) Preparation of light sensitive material 6.3 g of the epoxide resin Epikote 1009 of Shell Chemicals (prepared by the polycondensation of 2,2-bis(p-hydroxyphenyl) propane with excess epichlorhydrin in the presence of sodium hydroxide and having a molecular weight of about 3750) were dissolved in 33 ml anhydrous dioxane and 11.9 g chlorosulphonylcinnamylidene malonic acid as prepared above were added with stirring. The mixture was heated under reflux for 8 hours, cooled, diluted with an equal volume of dioxane and introduced dropwise into 1500 ml of water. The precipitated resin was filtered off and washed with more water on the filter.

(b) Preparation of a printing plate

The procedure of Example 1(d) was repeated using the above light sensitive material except that the developer for the exposed plate comprised a mixture of 4 parts 12% aqueous sodium metasilicate and 1 part of 2-ethoxyethanol.

EXAMPLE 3

(a) Preparation of light sensitive material 4g of 2-phenoxyethanol-formaldehyde resin, prepared by the acid catalysed condensation of 2-phenoxyethanol and formaldehyde, and 15 g of chlorosulphonylcinnamylidene malonic acid prepared as above were reacted in dioxane for 8 hours at reflux temperature. The product was isolated by introducing the cooled reaction mixture dropwise into 1 liter of water.

(b) Preparation of a printing plate

The procedure of Example 1(d) was repeated except that an exposure time of 5 minutes and a developer comprising 3 parts 15% aqueous trisodium phosphate and 1 part 2-ethoxyethanol were employed.

EXAMPLE 4

(a) Preparation of α-(chlorosulphonylphenyl)-chlorocinnamic acid (formula iv)

A mixture of 56.2 g 4-chlorobenzaldehyde, 54.4 g phenylacetic acid, 80 ml acetic anhydride and 40 ml triethylamine was refluxed for 5 hours. Unreacted 4-chlorobenzaldehyde was removed by steam distillation and the residue dissolved in aqueous alcohol and treated with decolourising carbon. Crystals of α-phenyl-4-chlorocinnamic acid were obtained on acidification of the solution. The product was recrystallised from alcohol and found to have a melting point of 202°-4° C. The chlorosulphonyl derivative was prepared according to the method described in Example 1.

(b) Preparation of light sensitive material

To a solution of 24 g resorcinol-formaldehyde resin (prepared as in Example 1) in 400 ml dimethylformamide were added 36 g of α-(chlorosulphonylphenyl)-chloro cinnamic acid prepared as above and 32 g chlorosulphonylcinnamylidene malonic acid prepared as in Example 1. The mixture was cooled to about 50° C. and a saturated solution of sodium carbonate added dropwise until the pH was between 8 & 10. After standing for four hours the solid was filtered off, dissolved in water and reprecipitated by acidifying the solution with hydrochloric acid.

(c) Preparation of a printing plate

The procedure of Example 1(d) was repeated except that the developer comprised 7.5% trisodium phosphate solution.

EXAMPLE 5

(a) Preparation of light sensitive material 10.6 g Wresinoid R751 (a phenolformaldehyde resin manufactured by Resinous Chemicals Ltd.) were dissolved in 40 ml anhydrous dioxane and added to 4.2 g p-azidobenzoyl chloride. 2.5 ml of pyridine were added and the mixture heated at 50° C. for 4 hours. The ester was precipitated by the addition of water, and air dried at room temperature. The product was dissolved in 200 ml dimethyl formamide and 24 g chlorosulphonylcinnamylidene malonic acid (prepared as in Example 1) were added with stirring. The solution was cooled to 5° C. and saturated sodium carbonate solution added dropwise until the pH was between 8 and 10. After leaving for about 8 hours the solid was filtered off, redissolved in water and the product precipitated by acidification with hydrochloric acid.

(b) Preparation of a printing plate

The procedure of Example 1(d) was repeated except that the developer comprised 7.5% trisodium phosphate solution.

EXAMPLE 6

(a) Preparation of chlorosulphonylcinnamylidenecyanoacetic acid (formula iii)

Cinnamaldehyde and cyanoacetic acid were condensed and the product converted to the corresponding chlorosulphonyl derivative using the method described in Example 1(a). The acid melted at 210° to 212° C.

(b) Preparation of light sensitive material

To a solution of 1.09 g resorcinol-formaldehyde resin (prepared as in Example 1) in 21 ml dimethylformamide was added a solution of 3.5 g of the above chlorosulphonylcinnamylidenecyanoacetic acid in 20 ml dimethylformamide. The mixture was cooled at 5° C. and the pH adjusted to about 9 with saturated sodium carbonate solution. After leaving for 8 hours the mixture was acidified and the product filtered off.

(c) Preparation of a printing plate

The procedure of Example 1(d) was repeated except that the developer comprised 0.5% trisodium phosphate solution.

EXAMPLE 7

(a) Preparation of chlorosulphonyl-δ-chlorocinnamylidene malonic acid (formula ii )

80 g Phosphoryl chloride were added dropwise to 80 ml cooled dimethyl formamide. 48 g acetophenone were added over 45 minutes and the mixture stirred at 0° C. for a further 60 minutes. After standing at room temperature overnight the mixture was poured into a solution of 600 g sodium acetate in 1500 ml water. β-Chlorocinnamaldehyde separated as a red oil. The mixture was ether extracted and the ethereal solution dried over anhydrous sodium sulphate. Evaporation of the ether yielded 44 g of β-chlorocinnamaldehyde. β-Chlorocinnamaldehyde and malonic acid were condensed to give δ-chlorocinnamylidene malonic acid and this was converted to the corresponding chlorosulphonyl derivative using the method described in Example 1(a).

(b) Preparation of light sensitive material 1.09 g Resorcinol-formaldehyde resin (prepared as in Example 1) and 3.33 g of δ-chlorosulphonylcinnamylidene malonic acid prepared as above were condensed according to the method described in Example 6(a).

(c) Preparation of a printing plate

The procedure of Example 6(c) was repeated.

EXAMPLE 8

(a) Preparation of light sensitive material 5.0 g chlorosulphonylcinnamylidene malonic (prepared as in Example 1) and 3.3 g of the product obtained by condensing together Lytron 822 (a styrene maleic anhydride copolymer sold by Monsanto) and excess ethylene diamine were reacted together in the presence of aqueous NaOH to give a pale yellow alkali soluble resin. The product was isolated by pouring the mixture into water, filtering off the precipitated material and drying in air at room temperature.

(b) Preparation of a printing plate

The process of Example 1(d) was repeated but the developer comprised 12% sodium metasilicate solution.

EXAMPLE 9

(a) Preparation of light sensitive material

The light sensitive material of Example 8 was prepared by reacting the styrene maleic anhydride copolymer with the condensation product of chlorosulphonylcinnamylidene malonic acid and excess ethylene diamine. This was effected by dissolving 12 g chlorosulphonylcinnamylidene malonic acid (prepared as in Example 1) in 240 ml dioxane and dropped the solution slowly into a vigorously stirred solution of 6 g ethylene diamine in 240 ml dioxane. The yellow solid produced was dissolved in water and dilute hydrochloric acid added until precipitation of the aminoethylsulphonamidocinnamylidene malonic acid hydrochloride was complete. 2 g of the Lytron 822 were dissolved in anhydrous dimethylformamide so as to give a 20% solution and 2.4 g of said hydrochloride in 10 ml dimethylformamide were added. The mixture was shaken to give a clear solution. 1.0 ml triethylamine was added and the mixture was stirred for a further 30 minutes. The product was isolated by pouring the mixture into water, filtering off the precipitated material and drying in air at room temperature.

(b) Preparation of a printing plate

The procedure of Example 8(b) was repeated.

EXAMPLE 10

(a) Preparation of light sensitive material 1.44 g of a polyethylene imine of molecular weight $50-100 \times 10^3$ (supplied by Dow Chemical Co. Ltd) were dissolved in 30 ml of 2N sodium hydroxide and added to 10.5 g chlorosulphonylcinnamylidene malonic acid (prepared as in Example 1) in 50 ml cyclohexanone. The mixture was shaken for 30 minutes and acidified. The product was filtered off and washed with water.

(b) Preparation of a printing plate 2 g of the above product were stirred with a hot mixture of dimethylformamide and dimethylsulphoxide and the undissolved material removed by filtration. 0.1 g Neozapon Blue FLE (Badische Anilin Soda Fabrik), a phthalocyanine blue dye, and 0.1 g 5-nitroacenaphthene were added and stirred into solution. The solution was then used to produce a light sensitive plate in the matter described in Example 1 and the plate was exposed and processed as described in that Example.

EXAMPLE 11

(a) Preparation of light sensitive material

Poly(para-aminostyrene) was prepared by polymerising p-aminostyrene in dioxane under an atmosphere of nitrogen and using azo bis isobutyronitrile as initiator. 31.7 g of chlorosulphonyl cinnamylidene malonic acid (prepared as in Example 1) and 11.9 g of the poly (para amino styrene) were dissolved in dioxane and a saturated solution of sodium bicarbonate was added until the mixture was permanently alkaline. After stirring for 30 minutes, the desired product was isolated by pouring into a large excess of dilute hydrochloric acid.

(b) Preparation of a printing plate

The procedure of Example 8(b) was repeated.

EXAMPLE 12

(a) Preparation of light sensitive material

A copolymer was prepared by copolymerising para amino styrene and methyl methacrylate in dioxane under an atmosphere of nitrogen and using azo bis iso butyronitrile as initiator. 21.9 g of the copolymer and 31.7 g of chlorosulphonyl cinnamylidene malonic acid were reacted together and the product isolated in the manner of Example 11a.

(b) Preparation of a printing plate

The procedure of Examples 8(b) was followed.

We claim:

1. A light-sensitive material comprising a polymer containing a plurality of primary and/or secondary amino groups and having attached to the nitrogen atoms of the amino groups groups of the formula

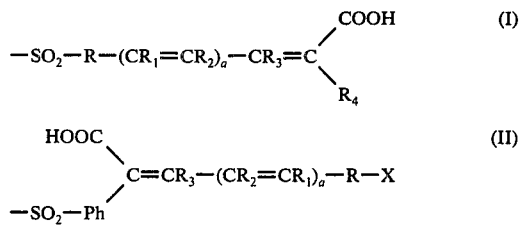

wherein R represents an aromatic radical; $a$ is zero or unity; $R_1$, $R_2$ and $R_3$, which may be the same or different each represents a hydrogen atom, a halogen atom, a cyano group, an alkyl group, an aryl group, an alkoxy group, an aryloxy group, an aralkyl group or an aralkoxy group; $R_4$, when $a$ is zero, is an alkoxy carbonyl group, a carboxyl group, or a phenyl group substituted with a deactivating group; $R_4$ when $a$ is unity, an alkyl group, an alkoxy carbonyl group, a carboxyl group, a cyano group, a phenyl group substituted with a deactivating group, or a hydrogen atom; Ph is a phenyl group; and X is a deactivating group.

2. A material according to claim 1, wherein the polymer is a poly(ethylene amine), poly (vinyl amine), an aniline/formaldehyde resin, the condensation product of a styrene/maleic anhydride copolymer with excess of an aliphatic or aromatic diamine, or the condensation product of an alkyl vinyl ether/maleic anhydride copolymer with excess of an aliphatic or aromatic diamine.

3. A material according to claim 1, wherein the groups have formula I in which $a$ is unity and $R_4$ is a carboxyl group.

4. A material according to claim 3, wherein the groups have formula I in which $a$ is unity, $R_4$ is a carboxyl group, and $R_1$, $R_2$ and $R_3$ are each hydrogen atoms.

5. A material according to claim 1, wherein the groups have formula I in which $a$ is unity, R is phenyl, $R_1$ is halogen, $R_2$ and $R_3$ are both hydrogen atoms, and $R_4$ is a carboxyl group; or in which $a$ is unity, R is phenyl, $R_1$ and $R_2$ and $R_3$ are each hydrogen atoms and $R_4$ is a cyano group or in which $a$ is zero, R is a phenyl group, $R_3$ is a hydrogen atom, and $R_4$ is a phenyl group substituted with a chlorine atom as deactivating group.

6. A material according to claim 1 wherein the groups have formula II in which $a$ is zero, R is phenyl, $R_3$ is a hydrogen atom, and X is a chloride atom.

7. A material according to claim 1 wherein the polymer includes a plurality of amino groups to the nitrogen atoms of which are attached groups having the general formula $-SO_2-R_{11}$ or $-CO-R_{12}$ wherein $R_{11}$ represents an aromatic radical which is free of a carboxylic acid group and $R_{12}$ represents an aliphatic or aromatic radical which is free of a carboxylic acid group.

8. A material according to claim 1 wherein the polymer is a condensation product of a styrene/maleic anhydride copolymer with excess ethylene diamine and wherein the groups have formula I in which $a$ is unity, $R_4$ is a carboxyl group and $R_1$, $R_2$ and $R_3$ are each halogen atoms.

* * * * *